(12) United States Patent
Morita et al.

(10) Patent No.: US 6,683,351 B2
(45) Date of Patent: Jan. 27, 2004

(54) SEMICONDUCTOR DEVICE HAVING STRUCTURES THAT CAN AVOID DETERIORATION CAUSED BY THE MANUFACTURING PROCESSING

(75) Inventors: Kiyoaki Morita, Hyogo (JP); Motoshige Igarashi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/225,128

(22) Filed: Aug. 22, 2002

(65) Prior Publication Data

US 2003/0057476 A1 Mar. 27, 2003

(30) Foreign Application Priority Data

Sep. 27, 2001 (JP) ........................................ 2001-297427

(51) Int. Cl.$^7$ .............................................. H01L 23/62
(52) U.S. Cl. ........................ 257/355; 257/356; 257/357; 257/360
(58) Field of Search ................................. 257/327–328, 257/355–363, 365, 202–212, 371–372; 408/309

(56) References Cited

U.S. PATENT DOCUMENTS

| | | | | |
|---|---|---|---|---|
| 5,235,201 A | * | 8/1993 | Honna | 257/357 |
| 5,410,161 A | * | 4/1995 | Narita | 257/41 |
| 5,550,701 A | * | 8/1996 | Nadd et al. | 361/103 |
| 5,760,445 A | * | 6/1998 | Diaz | 257/356 |
| 5,903,031 A | * | 5/1999 | Yamada et al. | 257/356 |
| 5,977,594 A | * | 11/1999 | Takao | 257/357 |
| 6,013,927 A | * | 1/2000 | Bothra et al. | 257/328 |
| 6,034,433 A | * | 3/2000 | Beatty | 257/758 |
| 6,292,927 B1 | * | 9/2001 | Gopisetty et al. | 716/11 |
| 6,294,397 B1 | * | 9/2001 | Jarvis et al. | 438/17 |
| 6,320,234 B1 | * | 11/2001 | Karasawa et al. | 257/371 |
| 6,344,385 B1 | * | 2/2002 | Jun et al. | 438/237 |
| 6,372,525 B1 | * | 4/2002 | Lin et al. | 438/14 |
| 6,417,544 B1 | * | 7/2002 | Jun et al. | 257/360 |
| 6,448,599 B1 | * | 9/2002 | Wang | 257/300 |
| 6,465,768 B1 | * | 10/2002 | Ker et al. | 250/214.1 |
| 6,465,848 B2 | * | 10/2002 | Ker et al. | 257/355 |
| 6,469,325 B1 | * | 10/2002 | Ishizuka et al. | 257/173 |
| 6,504,229 B2 | * | 1/2003 | Yamauchi et al. | 257/532 |
| 6,600,176 B2 | * | 7/2003 | Noguchi | 257/173 |
| 2001/0010093 A1 | * | 7/2001 | Nagayoshi et al. | 716/10 |
| 2002/0109190 A1 | * | 8/2002 | Ker et al. | 257/355 |

FOREIGN PATENT DOCUMENTS

| | | |
|---|---|---|
| JP | 10-256393 | 9/1998 |
| JP | 11-330467 | 11/1999 |
| JP | 2000-323582 | 11/2000 |

* cited by examiner

Primary Examiner—Long Pham
Assistant Examiner—Thao X. Le
(74) Attorney, Agent, or Firm—McDermott, Will & Emery (57) ABSTRACT

A semiconductor device restricting the antenna effect without complicating the manufacturing process and a manufacturing method of such a semiconductor device are provided. In addition, a semiconductor device ensuring matching or equality in characteristics of pairing transistors and a manufacturing method of such a semiconductor device are provided. The semiconductor device includes an interconnection that is placed on an insulating film covering a gate electrode and a semiconductor substrate and is electrically connected to the gate electrode. The semiconductor device also includes a dummy transistor that is formed on the semiconductor substrate and is unprovided with an interconnection required for a transistor. The interconnection is electrically connected to a source/drain region of the dummy transistor.

17 Claims, 7 Drawing Sheets

SEMICONDUCTOR DEVICE HAVING STRUCTURES THAT CAN AVOID DETERIORATION CAUSED BY THE MANUFACTURING PROCESSING

BACKGROUND OF THE INVENTION

1. Field of the Invention

The present invention relates to semiconductor devices and manufacturing methods thereof. More particularly, the present invention relates to a semiconductor device solving problems arising in processing steps employing plasma and a manufacturing method thereof, and also relates to a highly controllable semiconductor device constituting pair transistors in an analog circuit or the like and a manufacturing method thereof.

2. Description of the Background Art

In course of manufacturing a large-scale integrated circuit (LSI), thin-film formation and etching thereof are repeated a number of times, for which various kinds of plasma processing utilizing plasma are employed.

In manufacture of a metal oxide semiconductor field effect transistor (MOSFET) or the like, a gate electrode is formed on a semiconductor substrate with a gate insulating film interposed therebetween, and using it as a mask, an impurity is ion implanted into the main surface of the semiconductor substrate. For example, phosphorus as the impurity is introduced into a p-type semiconductor substrate to form an n-type diffusion layer, which becomes source/drain regions. An interlayer insulating film and an interconnection layer are then formed thereon. A plurality of interlayer insulating films and interconnection layers are stacked alternately one on another.

In a process step utilizing such plasma processing, an interconnection layer electrically connected to the gate electrode collects charges from the plasma, so that a large voltage is applied between the gate insulating film and the semiconductor substrate. This phenomenon is referred to as the "antenna effect". The antenna effect would not pose a serious problem with an LSI of low density.

With advancement of higher integration as seen in a dynamic random access memory (DRAM) or the like and promotion of downsizing of semiconductor devices, however, thinner gate insulating films and a greater number of interconnection layers have been employed. Consequently, the antenna effect has become prominent, and there are increased chances that the gate insulating films break due to charge up.

An antenna ratio as "area of interconnection/area of channel region" or "peripheral length of interconnection/peripheral length of channel region", which is in proportion to the degree of charge up, has been regulated in an effort to restrict the charge up.

In addition, structures each having a protective diode connected to an interconnection layer have been proposed to prevent damages to the gate insulating films due to the antenna effect (Japanese Patent Laying-Open Nos. 2000-323582, 10-256393, 11-330467).

The formation of such a protective diode, however, makes mask and interconnection patterns more complicated, and the LSI manufacturing process more cumbersome. Further, some semiconductor devices have structures in which placement of such protective diodes is difficult. In addition, the protective diode thus placed may become a major stumbling block for downsizing of the semiconductor device.

Figure 11:
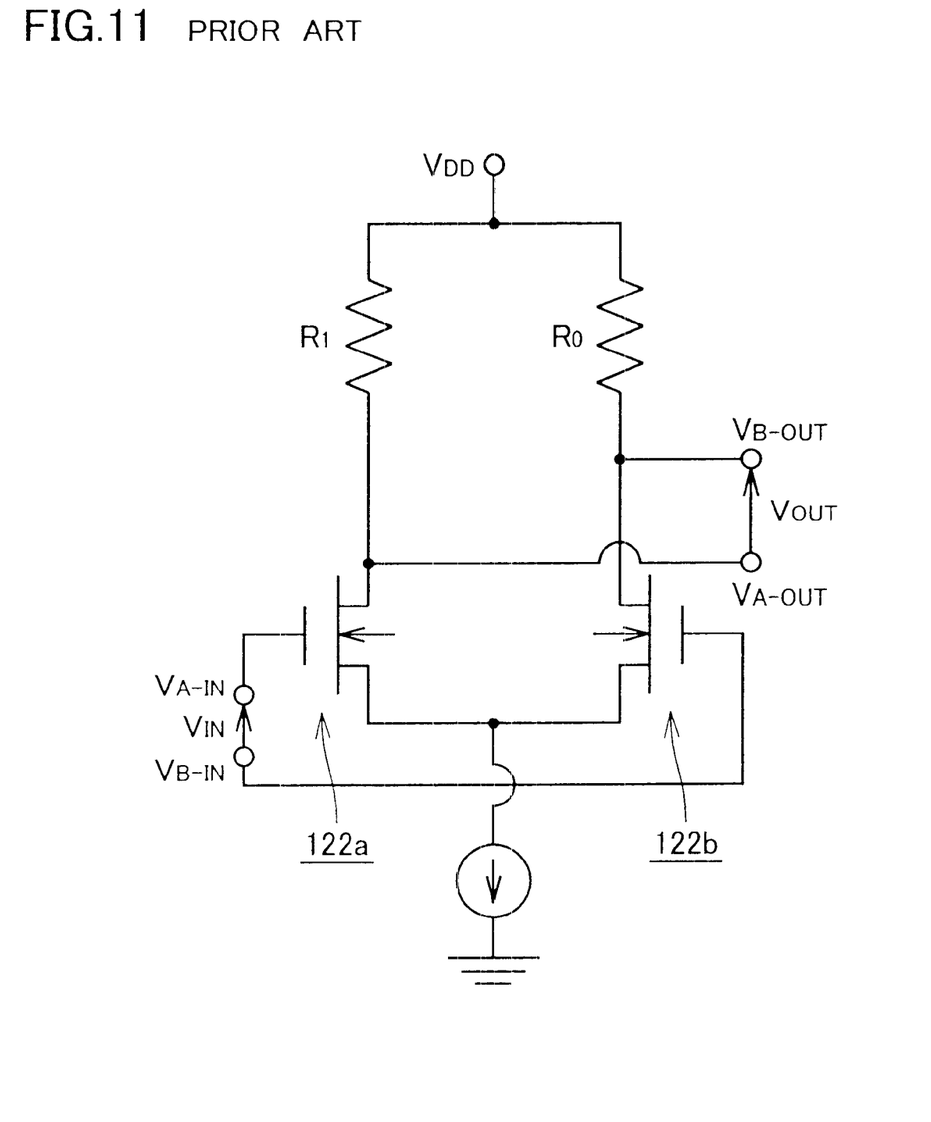
FIG. 11 is a circuit diagram of a differential circuit including pairing transistors.

In recent years, high-precision controllability of transistor characteristics has been required for an increasing number of circuits. FIG. 11 is a circuit diagram of a differential circuit including pair transistors commonly used in an analog circuit. In this differential circuit, two transistors 122a and 122b are required to have identical characteristics. Such matching or equality in characteristics of the pair transistors is impaired when their initial transistor characteristics like threshold voltages are different from each other due to different antenna ratios of interconnections connected to the two gates. As a result, variation in the threshold voltages or the like is amplified, resulting in variation in output voltage Vout of the differential circuit This causes defective circuits, and thus, the yield is degraded.

The above-described loss of matching characteristics of pair transistors is not solely attributable to the antenna effect. In addition to the countermeasures for the antenna effect, a variety of measures over the entire manufacturing process are required to ensure the matching characteristics of the pair transistors.

SUMMARY OF THE INVENTION

An object of the present invention is to provide a semiconductor device capable of restricting the antenna effect without an increase in complexity of the manufacturing process, and a manufacturing method thereof. Another object of the present invention is to provide a semiconductor device capable of readily ensuring matching in characteristics of pair transistors, and a manufacturing method thereof.

The semiconductor device according to an aspect of the present invention includes a plurality of transistors each having a gate electrode disposed on a semiconductor substrate on a gate insulating film. The semiconductor device includes: an interconnection that is arranged on an insulating film covering the gate electrode and the semiconductor substrate and is electrically connected to the gate electrode; a dummy transistor that is formed on the semiconductor substrate and is unprovided with an interconnection required for functioning as a transistor; and a connecting portion for electrically connecting the interconnection arranged on the insulating film to a source/drain region of the dummy transistor.

With such a structure, even if plasma is brought in contact with and introduced into the interconnection, the charges can escape via the source/drain region of the dummy transistor to the semiconductor substrate. This prevents accumulation of charges in the gate electrode, hindering application of a high voltage to the gate insulating film. As a result, the gate insulating film is prevented from suffering damage due to the antenna effect, so that initial transistor characteristics like threshold voltages can be maintained.

Even if the charges within the plasma are collected, not only during the aforementioned etching of the interconnection, but also during the formation of an insulating film thereon employing plasma, it is possible to make the charges escape via the source/drain region of the dummy transistor to the semiconductor substrate.

The dummy transistor is provided for dimensional control of the gate electrode. Non-uniformity in density of the gate pattern would affect photolithography and gate pattern etching, hindering an increase of dimensional accuracy. Thus, a dummy transistor is disposed to level the gate occupying ratio, and as a result, a gate pattern of uniform density is obtained.

The dummy transistor has its pattern formed in a mask pattern together with the pattern of a regular transistor, so that it is readily formed at the same time as the regular transistor. The source and drain regions of the dummy transistor are doped with impurities in the same concentrations as those of the regular transistor. Accordingly, compared to the case of providing a separate protective diode, provision of such a dummy transistor is simple in manufacture and advantageous to downsizing.

The semiconductor device according to another aspect of the present invention includes pairing transistors composed of a first transistor having a first gate electrode placed on a semiconductor substrate on a first gate insulating film and a second transistor having a second gate electrode placed on the semiconductor substrate on a second gate insulating film. The semiconductor device is provided with first and second interconnections placed on an insulating film covering the first and second gate electrodes and the semiconductor substrate. The first interconnection is electrically connected to the first gate electrode, and the second interconnection is electrically connected to the second gate electrode. The first and second interconnections have a structure ensuring equality or matching in characteristics of the first and second transistors.

The semiconductor device according to yet another aspect of the present invention includes pairing transistors composed of a first transistor having a first gate electrode placed on a semiconductor substrate on a first gate insulating film and a second transistor having a second gate electrode placed on the semiconductor substrate on a second gate insulating film, and also includes a dummy interconnection for averaging the effect of chemical mechanical polishing (CMP) that is provided in an upper layer than the first and second transistors. The dummy interconnection is arranged such that it does not overlap either of the pairing transistors in two dimensions, or such that a portion of the dummy interconnection overlapping the first transistor and a portion thereof overlapping the second transistor are equivalent to each other.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, embodiments of the present invention will be described with reference to the drawings.

First Embodiment

Figure 1:
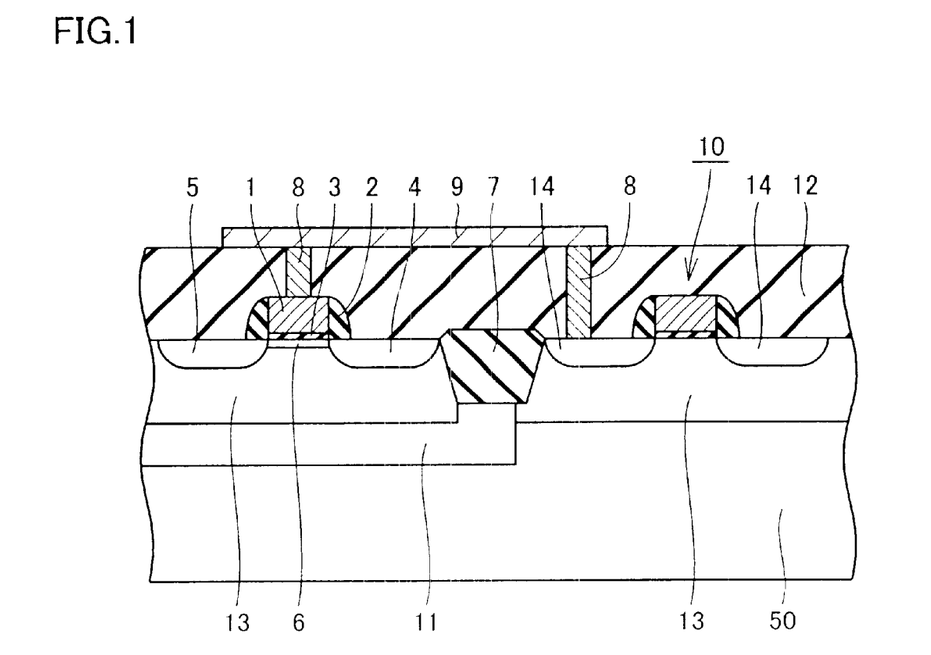
FIGS. 1–4 are cross sectional views of the semiconductor devices according to first to fourth embodiments of the present invention, respectively.

FIG. 1 shows a structure of the semiconductor device of the first embodiment. Referring to FIG. 1, a separating trench 7 with a depth of 300 nm is provided on a silicon substrate 50 for separation of elements. Formed in an element forming region is an n type bottom well region 11 having an n type impurity introduced therein with a concentration of, e.g., $3\times10^{13}/cm^2$. In the case of an n type transistor, a p type well region 13 having a p type impurity introduced therein with a concentration of, e.g., $2\times10^{13}/cm^2$ is formed on bottom well region 11. In the case of a p type transistor, an n type well having an n type impurity introduced therein to the same degree as p type well region 13 in the case of the n type transistor is formed. Although the case of the n type transistor will now be described, a structure of p type transistor, except the bottom well, can be realized by reversing the conductivity types.

In a shallow region of the above-described well region 13 above which a gate electrode 1 is to be formed, a channel region 6 is formed which has a p type impurity introduced therein with a concentration of, e.g., $5\times10^{12}/cm^2$. Formed on channel region 6 is a gate oxide film 3 made of oxinitride film of, e.g., 2 nm thick in the case of 1.5 V transistor. The gate electrode 1 is placed on this gate oxide film 3. Gate electrode 1 is made of polysilicon of, e.g., 150 nm thick and having an n type impurity concentration of, e.g., $5\times10^{13}/cm^2$. Sidewalls 2 of nitride film are formed on both sides of gate electrode 1. A drain region 4 and a source region 5 with an n type impurity concentration of $3\times10^{14}/cm^2$, for example, are formed to sandwich channel region 6.

An interlayer insulating film 12 made of silicon oxide film of, e.g., 400 nm thick is formed on the element forming region and the element separating region. A contact hole is provided in this interlayer insulating film, which is filled with tungsten (W), for example, to form a plug 8. Formed on the interlayer insulating film is a first layer interconnection 9 of, e.g., 200 nm thick, which is made of aluminum (Al), copper (Cu) or the like. This first layer interconnection 9 is connected via plug 8 to gate electrode 1. Although not shown in FIG. 1, there is a case where the first layer interconnection is connected to drain region 4 or source region 5.

The present embodiment is characterized in that a dummy transistor 10 is provided, as shown in FIG. 1, which is unprovided with an interconnection as a regular transistor. This dummy transistor 10 is provided for the purpose of dimensional control of the gate electrode. If a gate pattern is uneven in density, photolithography and gate pattern etching will be affected by such uneven density, in which case dimensional precision cannot be improved. Thus, such a dummy transistor is provided to average the gate occupying ratio, and thus to realize a gate pattern of even density.

Dummy transistor 10, having its pattern formed in a mask pattern together with that of a regular transistor, can be readily formed at the same time as the formation of the regular transistor. Dummy transistor 10 has its source/drain region introduced with impurity of the same concentration as in the source/drain region of the regular transistor. Only the difference is that the dummy transistor is unprovided with the interconnection as the regular transistor, since it is not expected to function as a transistor. In the present embodiment, first layer interconnection 9, which is connected to gate electrode 1 as described above, is also connected to the source/drain region of the dummy transistor.

Effects of the dummy transistor will now be explained. Firstly, plasma is generated when a first layer interconnection film is dry-etched to form the first layer interconnection, and charges from the plasma are introduced into the first layer interconnection. If the first layer interconnection is connected solely to the gate electrode, a large voltage will be applied to the gate insulating film. According to the present embodiment, however, first layer interconnection 9 is also connected to source/drain region 14 of dummy transistor 10. Thus, the charges escape through source/drain region 14 of dummy transistor 10 to semiconductor substrate 50. As a result, the gate insulating film is prevented from suffering damage due to a high potential that would be otherwise applied thereto.

Similarly, if multi-layered interconnections having an additional upper layer interconnection are being dry-etched, the charges generated within the plasma escape to semiconductor substrate 50 through source/drain region 14 of dummy transistor 10 connected to the first layer interconnection. In addition, in the case where the formation of the first layer interconnection is followed by formation of interlayer insulating film and interconnection film using plasma, even if the charges within the plasma are being introduced into the first interconnection, it is possible to let the charges escape through source/drain region 14 of dummy transistor 10 to semiconductor substrate 50.

The source/drain region of the dummy transistor tends to increase parasitic capacity that may cause signal delay in the circuit. As such, the area of the source/drain region of the dummy transistor is preferably made smaller than that of the source/drain region of a regular transistor.

If dummy transistor 10 is located within n type bottom well 11 as seen in two dimensions, the charges from the plasma become less likely to escape to semiconductor substrate 50 due to the blocking layer of n type bottom well 11. Therefore, the dummy transistor is preferably located outside the n type bottom well when seen in two dimensions.

Second Embodiment

Figure 2:
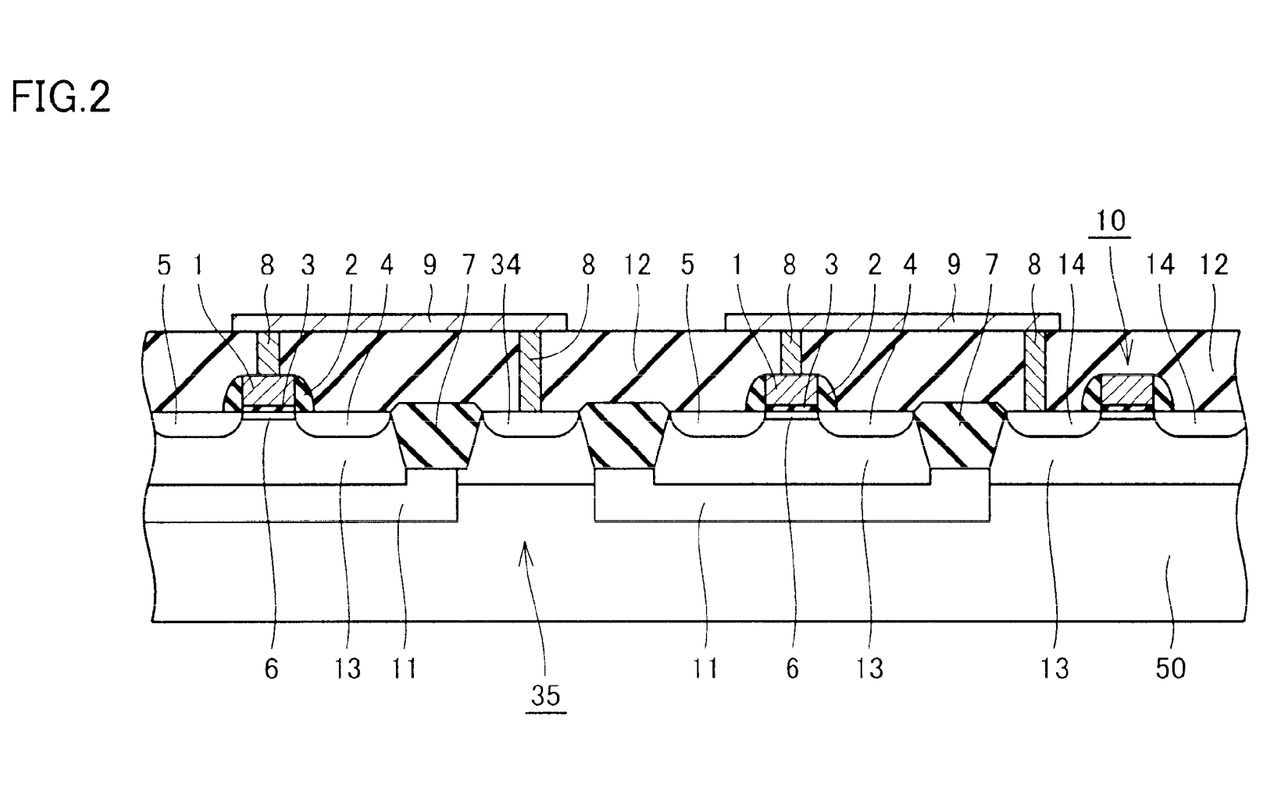

FIG. 2 shows the semiconductor device of the second embodiment, which includes interconnection structures for both the gate electrode as in the first embodiment and another gate electrode. Referring to FIG. 2, the semiconductor device of the second embodiment includes, as in the first embodiment, interconnection 9 that is connected to gate electrode 1 and to source/drain region 14 of dummy transistor 10. It also includes, unlike the first embodiment, another interconnection 9 that is connected to the another gate electrode and to a region 34 of a protective diode 35.

If p type well 13 has been provided, region 34 of protective diode 35 may be formed by introducing an n type impurity to the same degree as the source/drain region of the transistor. In this case, the silicon substrate may be of an n type or a p type. If an n type silicon substrate is being employed, it may be connected to the p type well itself, without forming an impurity region. Generally, as a structure of protective diode, any of the following may be employed: "$n^+$ type region/p type well/p type silicon substrate", "$p^+$ type region/n type well/p type silicon substrate", and "n type well/p type semiconductor substrate".

The protective diode has effects identical to those of the source/drain region of the dummy transistor. Specifically, plasma is generated when the first layer interconnection film is dry-etched to form the first layer interconnection, and the charges are introduced into the first layer interconnection. If the first layer interconnection is connected only to the gate electrode, a large voltage would be applied to the gate insulating film. In the present embodiment, however, the first layer interconnection 9 is also connected to region 34 of protective diode 35. Thus, the charges can escape via the protective diode to semiconductor substrate 50. Application of a high potential to the gate insulating film is avoided, and thus, the gate insulating film is prevented from suffering damage.

Similarly, upon dry etching of multi-layered interconnections having an additional upper layer interconnection, the charges generated within the plasma can escape via protective diode 35 connected to the first layer interconnection to semiconductor substrate 50. Further, in the case where interlayer insulating film and interconnection film are formed using plasma after the formation of the first layer interconnection, even if the charges within the plasma are being introduced into the first layer interconnection, it is possible to let them escape via protective diode 35 to semiconductor substrate 50.

The dummy transistor and the diode may be employed together to obtain optimal arrangement for downsizing. They may also be arranged to achieve an optimal combination thereof taking the manufacturing process into consideration.

Region 34 of protective diode 35 is likely to increase parasitic capacity which would cause signal delay in the circuit. Thus, its area is preferably made smaller than that of the active region for contact that is provided in the well to receive a potential.

Further, if protective diode 35 is located within n type bottom well 11 as seen in two dimensions, the blocking layer of n type bottom well 11 would make it difficult for the charges from the plasma to escape to semiconductor substrate 50. Thus, protective diode 35 is preferably located outside the n type bottom well in two dimensions.

Third Embodiment

Figure 3:
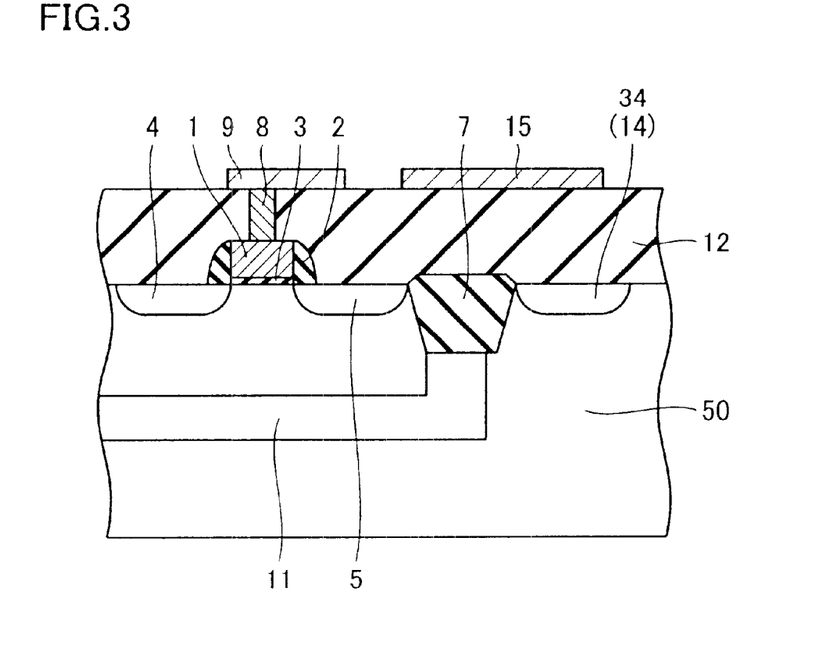

FIG. 3 shows the semiconductor device of the third embodiment. The semiconductor device of the third embodiment includes a transistor having a gate electrode as shown in FIG. 3, which is different from the transistors of the first and second embodiments. It also includes a first layer interconnection connected to the gate electrode 1, which is also different from the interconnections of the first and second embodiments. The first layer interconnection 9 of the present embodiment is not connected to either of the source/drain region 14 of the dummy transistor and the region 34 of the protective diode.

If a neighboring interconnection 15 located next to the first layer interconnection 9 is connected to either of the source/drain region 14 of the dummy transistor and the region 34 of the protective diode, damage to gate insulating film 3 due to the effect of the plasma at the time of dry etching would be intensified. Thus, the neighboring interconnection 15 is not connected to either of the source/drain region 14 of the dummy transistor and the region 34 of the protective diode.

There however is an exceptional case. If n type bottom well 11 is formed beneath the transistor having the another gate electrode, and the protective diode or the dummy transistor corresponding to the neighboring interconnection 15 is located outside the n type bottom well as seen in two dimensions, then the neighboring interconnection may be connected to the source/drain region of the dummy transistor or the region of the protective diode. In this case, the charges within the plasma can escape from the neighboring interconnection through the protective diode or the dummy transistor to the semiconductor substrate with great ease, regardless of the arrangement of the first layer interconnection and the neighboring interconnection.

In the arrangement shown in FIG. 3, n type bottom well 11 is provided beneath the transistor, but is not provided beneath the region 34 of the protective diode or the source/drain region 14 of the dummy transistor. Therefore, the neighboring, first layer interconnection 15 may be connected to the region 14, 34.

Fourth Embodiment

Figure 4:
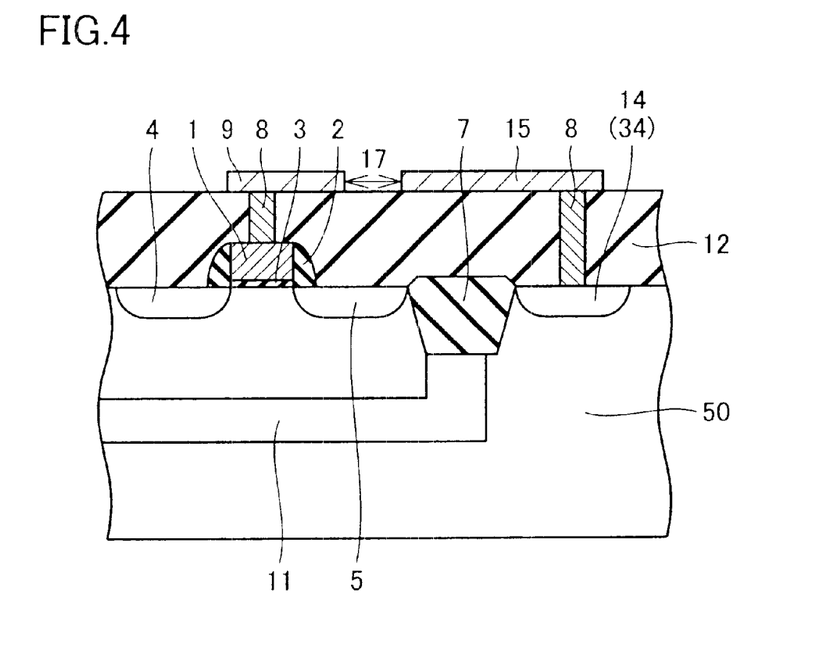

FIG. 4 illustrates the semiconductor device of the fourth embodiment. The present embodiment is similar to the third embodiment in that it is directed to the interconnection structure for a transistor that is different from those of the first and second embodiments but is provided within the same semiconductor device. In the fourth embodiment, first layer interconnection 9 connected to gate electrode 1 of the transistor via plug 8 is unconnected to either of the source/drain region 14 of the dummy transistor or the region 34 of protective diode 35, as in the third embodiment. In this embodiment, however, unlike the third embodiment, the neighboring interconnection 15 located next to the first layer interconnection 9 is connected to either one of the source/drain region 14 of dummy transistor 10 or the region 34 of protective diode 35.

In this case, the damage suffered by gate insulating film 3 due to the antenna effect at the time of plasma processing changes dependent on a gap 17 between the first layer interconnection 9 and the neighboring interconnection 15. The damage to gate insulating film 3 increases as the gap 17 decreases, because it restricts circumvention of electrons within the plasma more severely. Thus, the gap 17 is prevented from becoming not greater than a minimum line width of the semiconductor device. Keeping the gap greater than the minimum line width, the damage to gate insulating film 3 is kept within the allowable range, so that it is possible to achieve a highly reliable semiconductor device in a simple manner.

There is an exceptional case again, which is the case where n type bottom well 11 is formed beneath the transistor having the another gate electrode, and the protective diode 35 or the dummy transistor 10 to which the neighboring interconnection 15 is connected is located outside the n type bottom well as seen in two dimensions. In such a case, gap 17 between first layer interconnection 9 and neighboring interconnection 15 may be made as small as the minimum line width. This is because, even with such a very narrow gap, the charges within the plasma can escape from the neighboring interconnection through the protective diode or the dummy transistor to the semiconductor substrate with great ease. Thus, the amount of charges directed toward the gate electrode is restricted, so that the voltage applied to the gate insulating film is kept low.

Fifth Embodiment

Figure 5:
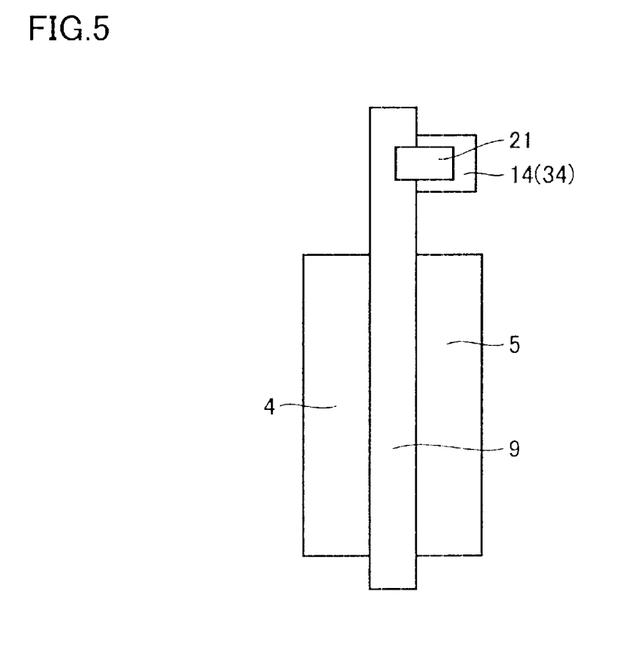
FIG. 5 is a top plan view of the semiconductor device according to a fifth embodiment of the present invention.

FIG. 5 shows the semiconductor device of the fifth embodiment. In this embodiment, as shown in FIG. 5, the plug being connected to the gate electrode of the transistor is provided as a shared contact 21, which is connected to both the gate electrode and the source/drain region 14 of the dummy transistor or the region 34 of the protective diode. With such a structure, it is possible to simplify the manufacturing process, while preventing damage to the gate insulating film by letting the charges within the plasma escape to the substrate.

When providing the dummy transistor or the protective diode, the parasitic capacity causing signal delay in the circuit should be suppressed. In the case of the protective diode, its area is preferably made smaller than the area of the active region for contact that is provided in the well to have a potential. In the case of the dummy transistor, its area is preferably made smaller than that of the regular transistor.

Sixth Embodiment

Figure 6:
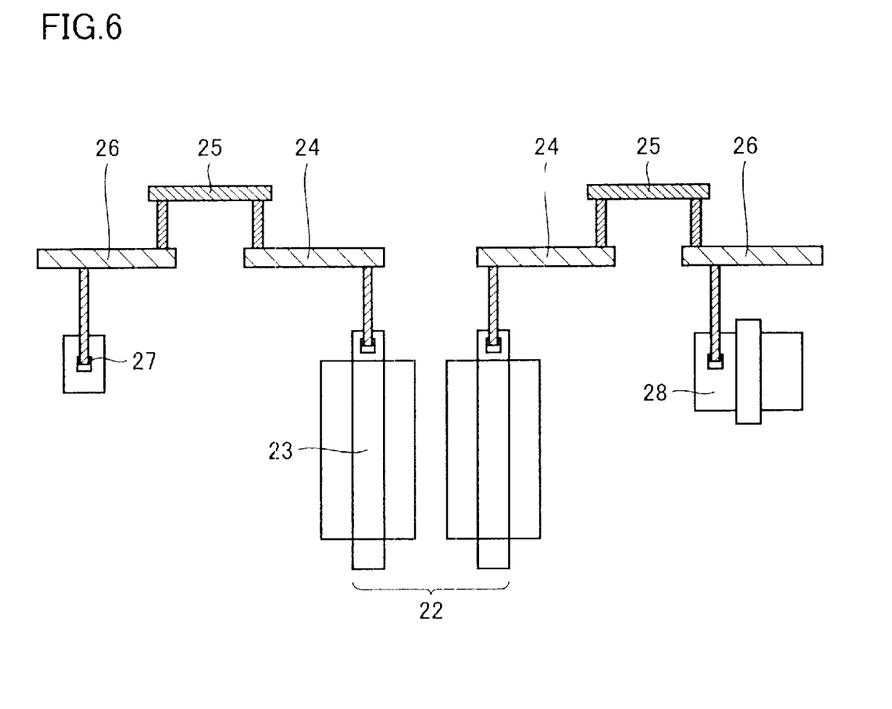
FIG. 6 schematically shows the semiconductor device according to a sixth embodiment of the present invention.

FIG. 6 schematically shows the semiconductor device of the sixth embodiment. In FIG. 6, the interconnections are shown in cross section, and the remaining portions are shown in plan. The present embodiment is directed to pairing transistors employed in an analog circuit or the like. The pairing transistors 22 require especially high-precision control of transistor characteristics. Thus, matching or equality in characteristics of these transistors is very important.

Thus, in order to ensure equality in damages caused by the antenna effect in plasma processing, the transistors are laid out such that they have the identical antenna ratios. The antenna ratio is defined as "the area of interconnection/the area of channel region" or "the peripheral length of interconnection/the peripheral length of channel region". It can be considered as an index indicating how easily charges are collected from the plasma per gate area. The transistors with equal antenna ratios are supposed to suffer equal damages.

The gate insulating film will suffer the damage due to the antenna effect, not only at the time of dry etching of the interconnection, but also upon formation of an insulating film on the interconnection using plasma, or upon formation of an interconnection layer 25 further thereon. In such a case, the above-described antenna ratio is calculated by taking into consideration the first layer interconnection 24 and the second layer interconnection 25 as the interconnection in combination. As a result, equality or matching in characteristics of the pairing transistors is ensured with high accuracy.

It should be noted, however, that such restraint on layout to equalize the antenna ratios of the pairing transistors becomes unnecessary once interconnections 24, 25 connected to the gate electrodes are each connected via an interconnection 26 or the like to a dummy transistor 28 or a protective diode 27. With interconnections 24, 25 connected to the dummy transistor or the protective diode, the charges within the plasma can escape through it to the semiconductor substrate, so that the pairing transistors will not suffer damages. Thus, adjustment of the antenna ratios becomes unnecessary.

Seventh Embodiment

Figure 7:
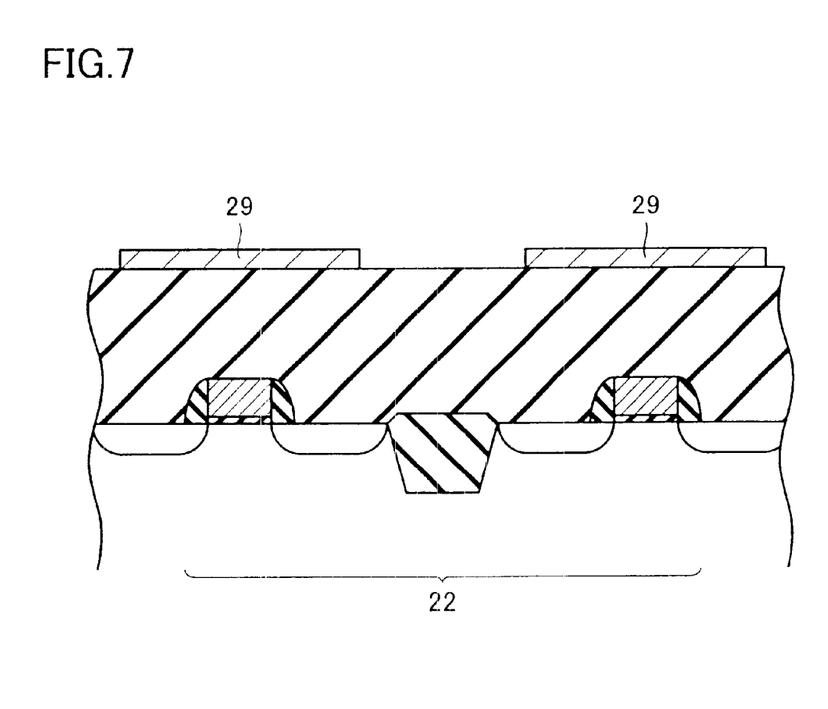
FIG. 7 is a cross sectional view of the semiconductor device according to a seventh embodiment of the present invention, wherein a CMP averaging dummy interconnection is equivalently placed on two transistors.

FIG. 7 shows the semiconductor device of the seventh embodiment. As explained above, emphasis is placed on the matching or equality in characteristics of the pairing transistors 22 for use in an analog circuit.

In multi-layered interconnections, an electrically floating dummy interconnection 29 is automatically arranged to improve controllability of CMP. If this dummy interconnection 29 is arranged above transistors, effects on channel interfaces at the time of hydrogen sintering after formation of interconnections come to vary, which causes changes in transistor characteristics.

If this dummy interconnection for averaging the CMP is arranged biased to either one of the pairing transistors, the matching or equality in transistor characteristics will be impaired. Accordingly, as shown in FIG. 7, the dummy interconnection is arranged such that it will equally affect the pairing transistors. In general, the dummy interconnection is arranged symmetrically with respect to an intermediate line therebetween.

Figure 8:
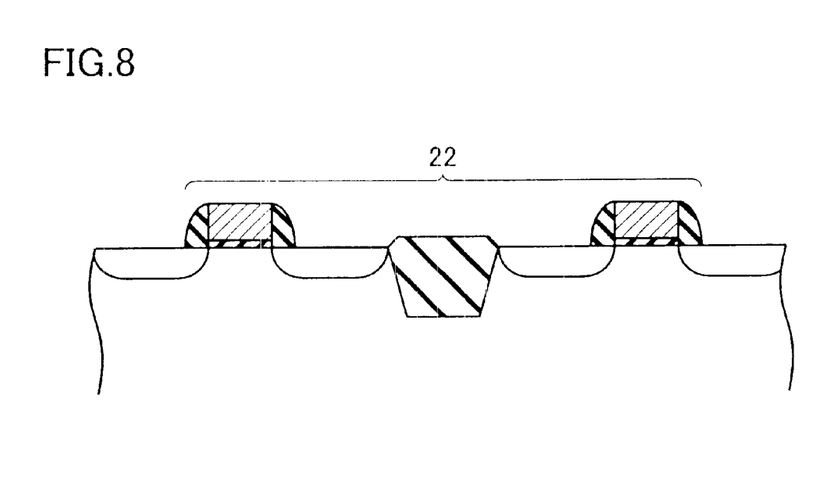
FIG. 8 is a cross sectional view of the semiconductor device according to the seventh embodiment, wherein the CMP averaging dummy interconnection is not placed on the two transistors.

If possible, the CMP averaging dummy interconnection is unprovided over the both transistors, as shown in FIG. 8.

Further, it is desirable that not only the CMP averaging dummy interconnection but also the regular upper layer interconnection are laid out equivalently with respect to the two transistors.

Eighth Embodiment

Figure 9:
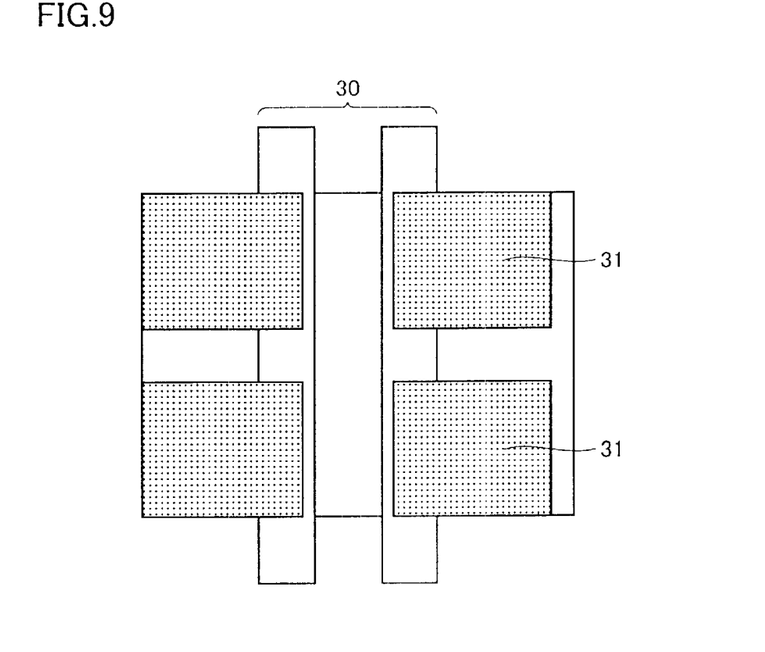
FIG. 9 is a top plan view of the semiconductor device according to an eighth embodiment of the present invention, wherein a CMP averaging dummy interconnection is equivalently placed on pairing resistance elements.

FIG. 9 illustrates the semiconductor device according to the eighth embodiment. Pairing resistance elements 30 made of, e.g., polysilicon for use in an analog circuit or the like are required to have precisely matching characteristics. If the CMP averaging dummy interconnection 31 is being arranged above pairing resistance elements 30, activating ratios of the carriers, and hence, the resistance values will change due to effects of subsequent heat treatment or the like.

Thus, if provision of CMP averaging dummy interconnection 31 is necessary, it is arranged equivalently with respect to the pairing resistance elements, as shown in FIG. 9.

Figure 10:
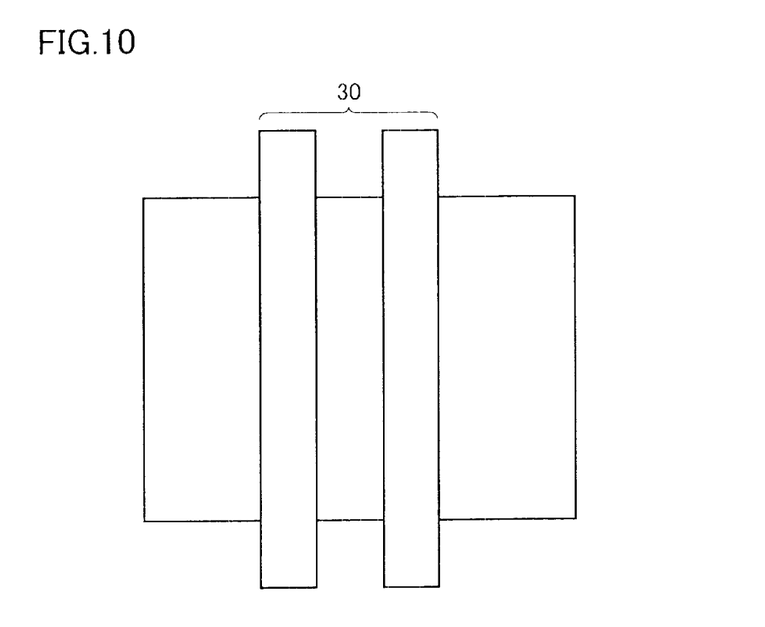
FIG. 10 is a top plan view of the semiconductor device according to the eighth embodiment, wherein the CMP averaging dummy interconnection is not placed on the two resistance elements.

Otherwise, the dummy interconnection is unprovided above the resistance elements, as shown in FIG. 10.

Further, it is desirable that not only the CMP averaging dummy interconnection but also the multi-layered interconnections are laid out above the pairing resistance elements equivalently with respect to the both elements.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having a plurality of transistors each having a gate electrode arranged on a semiconductor substrate on a gate insulating film, comprising:
   an interconnection arranged on an insulating film covering said gate electrode and said semiconductor substrate and electrically connected to said gate electrode through a first connecting portion formed on the upper part of said gate electrode;
   a dummy transistor formed on said semiconductor substrate and unprovided with any connection required for a transistor; and
   a second connecting portion electrically connecting said interconnection arranged on the insulating film with a source/drain region of said dummy transistor.

2. The semiconductor device according to claim 1, wherein the source/drain region of said dummy transistor is smaller than a source/drain region of said transistor.

3. The semiconductor device according to claim 1, wherein another interconnection placed on said insulating film and electrically connected to another gate electrode different from said gate electrode is electrically connected through another connecting portion to a diode formed in said semiconductor substrate.

4. The semiconductor device according to claim 3, wherein said diode has an area smaller than an area of an active region for contact that is provided in a well to have a potential.

5. The semiconductor device according to claim 3, wherein said diode is formed from either one of "a second conductivity type impurity region/a first conductivity type well/a first conductivity type semiconductor substrate", "a first conductivity type impurity region/a second conductivity type well/a first conductivity type semiconductor substrate" and "a second conductivity type well/a first conductivity type semiconductor substrate".

6. The semiconductor device according to claim 3, wherein a bottom well is unprovided beneath at least one of said dummy transistor and said diode.

7. The semiconductor device according to claim 3, wherein said connecting portion comprises a shared contact that overlaps, in two dimensions, both said interconnection and the source/drain region of the dummy transistor, and said another connecting portion comprises a shared contact that overlaps both said another interconnection and the diode.

8. The semiconductor device according to claim 3, comprising another gate electrode different from said gate electrode, another interconnection placed on said insulating film and electrically connected to the another gate electrode, and a neighboring interconnection located next to the another interconnection, wherein
   said another interconnection and said neighboring interconnection are electrically unconnected to any of a source/drain region of the transistor, the source/drain region of the dummy transistor and the diode provided in said semiconductor substrate.

9. The semiconductor device according to claim 3, comprising another gate electrode different from said gate electrode, another interconnection placed on said insulating film and electrically connected to the another gate electrode, and a neighboring interconnection located next to the another interconnection, wherein
   said neighboring interconnection is electrically connected to one of a source/drain region of the transistor, the source/drain region of the dummy transistor and the diode provided in said semiconductor substrate, and
   a bottom well is provided beneath the transistor having said another gate electrode, and is unprovided beneath the one of the source/drain region of the transistor, the source/drain region of the dummy transistor and the diode to which said neighboring interconnection is connected.

10. The semiconductor device according to claim 3, comprising another gate electrode different from said gate electrode, another interconnection placed on said insulating film and electrically connected to the another gate electrode, and a neighboring interconnection located next to the another interconnection, wherein
    said another interconnection is electrically unconnected to any of a source/drain region of the transistor, the source/drain region of the dummy transistor and the diode provided in said semiconductor substrate,
    said neighboring interconnection is electrically connected to at least one of the source/drain region of the transistor, the source/drain region of the dummy transistor and the diode provided in said semiconductor substrate, and
    a gap between said another interconnection and said neighboring interconnection is greater than a minimum line width of the semiconductor device.

11. The semiconductor device according to claim 3, comprising another gate electrode different from said gate electrode, another interconnection placed on said insulating film and electrically connected to the another gate electrode, and a neighboring interconnection located next to the another interconnection, wherein
    said another interconnection is electrically unconnected to any of a source/drain region of the transistor, the source/drain region of the dummy transistor and the diode provided in said semiconductor substrate,
    said neighboring interconnection is electrically connected to at least one of the source/drain region of the transistor, the source/drain region of the dummy transistor and the diode provided in said semiconductor substrate, and a bottom well is provided beneath a transistor having said another gate electrode, and is unprovided beneath the at least one of the source/drain region of the transistor, the source/drain region of the dummy transistor and the diode to which said neighboring interconnection is connected.

12. A semiconductor device having pairing transistors composed of a first transistor having a first gate electrode placed on said semiconductor substrate on a first gate insulating film and a second transistor having a second gate electrode arranged on said semiconductor substrate on second gate insulating film, comprising:

first and second interconnections placed on an insulating film covering said first and second gate electrodes and said semiconductor substrate, and electrically connected to said first and second gate electrodes, respectively, said first and second interconnections having a structure configured for matching characteristics of said first and second transistors, and for equalizing antenna ratios of said first and second interconnections in which said antenna ratio is defined alternatively as (1) the ratio of area of interconnection and area of channel region or (2) the ratio of peripheral length of interconnection and peripheral length of channel region.

13. A semiconductor device having pairing transistors composed of a first transistor having a first gate electrode placed on a semiconductor substrate on a first gate insulating film and a second transistor having a second gate electrode arranged on said semiconductor substrate on a second gate insulating film, comprising:

first and second interconnections placed on an insulating film covering said first and second gate electrodes and said semiconductor substrate, and electrically connected to said first and second gate electrodes, respectively, said first and second interconnections having a structure configured for matching characteristics of said first and second transistors, and at least one of a diode and a dummy transistor without an interconnection required for a transistor provided in said semiconductor substrate, wherein the structure is configured for having said first and second interconnections electrically connected to either one of said diode and said dummy transistor.

14. A semiconductor device having pairing transistors composed of a first transistor having a first gate electrode placed on a semiconductor substrate on a first gate insulating film and a second transistor having a second gate electrode placed on said semiconductor substrate on a second gate insulating film, and a dummy interconnection for averaging the effect of chemical mechanical polishing provided in an upper layer above said first and second transistors, said dummy interconnection being non-overlapping with said pairing transistors as seen in two dimensions, or being arranged such that a portion of said dummy interconnection overlapping said first transistor and a portion of said dummy interconnection overlapping said second transistor become equivalent to each other and being disconnected from interconnections of said first and second transistors.

15. The semiconductor device according to claim 14, wherein an interconnection pattern in an upper layer than said first and second transistors is also prevented from overlapping said pairing transistors as seen in two dimensions, or is arranged such that a portion of the interconnection pattern overlapping said first transistor and a portion of the interconnection pattern overlapping said second transistor become equivalent to each other.

16. The semiconductor device according to claim 14, comprising pairing resistance elements composed of a first resistance element and a second resistance element equivalent to each other, wherein said dummy interconnection is prevented from overlapping said pairing resistance elements as seen in two dimensions, or is arranged such that a portion of said dummy interconnection overlapping said first resistance element and a portion of said dummy interconnection overlapping said second resistance element become equivalent to each other.

17. The semiconductor device according to claim 16, wherein an interconnection pattern in an upper layer than said first and second resistance elements is also prevented from overlapping said pairing resistance elements as seen in two dimensions, or is arranged such that a portion of the interconnection pattern overlapping said first resistance element and a portion of the interconnection pattern overlapping said second resistance element become equivalent to each other.

* * * * *